(12) United States Patent
Chil Keun et al.

(10) Patent No.: US 7,714,341 B2
(45) Date of Patent: May 11, 2010

(54) SUB-MOUNT FOR MOUNTING LIGHT EMITTING DEVICE AND LIGHT EMITTING DEVICE PACKAGE

(75) Inventors: Park Chil Keun, Seoul (KR); Song Ki Chang, Uiwang-si (KR); Kim Geun Ho, Seoul (KR); Won Yu Ho, Seoul (KR)

(73) Assignees: LG Innotek Co., Ltd., Seoul (KR); LG Electronics Inc., Seoul (KR)

( * ) Notice: Subject to any disclaimer, the term of this patent is extended or adjusted under 35 U.S.C. 154(b) by 66 days.

(21) Appl. No.: 11/633,493

(22) Filed: Dec. 5, 2006

(65) Prior Publication Data
US 2008/0006837 A1 Jan. 10, 2008

(30) Foreign Application Priority Data
Jul. 7, 2006 (KR) ...................... 10-2006-0063873

(51) Int. Cl.
*H01L 33/00* (2010.01)
(52) U.S. Cl. ........................... 257/98; 257/99; 257/100; 257/E33.072

(58) Field of Classification Search .................... 257/81, 257/621, 774, 98, 99, E33.058, E33.057, 257/E33.066, E33.072, 79, 100; 438/26, 438/29
See application file for complete search history.

(56) References Cited

U.S. PATENT DOCUMENTS

| 5,414,300 A * | 5/1995 | Tozawa et al. ............... 257/704 |
| 7,183,587 B2 * | 2/2007 | Negley et al. .................. 257/99 |
| 2006/0198162 A1 * | 9/2006 | Ishidu et al. ................. 362/623 |
| 2007/0063209 A1 * | 3/2007 | Sugiura et al. ................. 257/98 |

* cited by examiner

*Primary Examiner*—Evan Pert
*Assistant Examiner*—Selim Ahmed
(74) *Attorney, Agent, or Firm*—McKenna Long & Aldridge LLP

(57) ABSTRACT

A sub-amount for mounting a light emitting device and a light emitting device package using the sub-mount are disclosed. The light emitting device package includes a package body having a mount for mounting a light emitting device, and through holes, electrodes formed on the package body, and a reflective layer arranged on one of the electrodes formed on an upper surface of the package body. The reflective layer has openings for enabling the light emitting device to be coupled to the electrodes.

18 Claims, 13 Drawing Sheets

SUB-MOUNT FOR MOUNTING LIGHT EMITTING DEVICE AND LIGHT EMITTING DEVICE PACKAGE

This application claims the benefit of Korean Patent Application No. 10-2006-0063873, filed on Jul. 7, 2006, which is hereby incorporated by reference as if fully set forth herein.

BACKGROUND OF THE INVENTION

1. Field of the Invention

The present invention relates to a sub-mount for mounting a light emitting device and a light emitting device package, and more particularly, to a sub-mount for mounting a light emitting device which enables emission of light having a uniform intensity of illumination from the light emitting device, and a light emitting device package which is capable of having uniform brightness, using the sub-mount.

2. Discussion of the Related Art

Light emitting diodes (LEDs) are well known as semiconductor light emitting devices that convert current to light. A red LED using GaAsP compound semiconductor has been commercially available since 1962, and together with a GaP:N-based green LED, has been a light source in electronic apparatuses, such as image displays.

A wavelength of light emitted from such an LED depends on a semiconductor material used to fabricate the LED. This is because the wavelength of the emitted light depends on a band gap of the semiconductor material representing energy difference between valence-band electrons and conduction-band electrons.

Gallium nitride (GaN) compound semiconductor has been highlighted in the field of high-power electronic devices because it exhibits a high thermal stability and a wide band gap of 0.8 to 6.2 eV. One of the reasons why GaN compound semiconductor has been highlighted is that it is possible to fabricate a semiconductor layer capable of emitting green, blue, or white light, using GaN in combination with other elements, for example, indium (In), aluminum (Al), etc.

That is, it is possible to adjust the wavelength of light to be emitted, using GaN in combination with other appropriate elements. For example, it is possible to fabricate a blue LED useful for optical recording or a white LED to replace a glow lamp.

By virtue of the recent success of growth of InGaN thin film, it has been possible to fabricate high-luminescent green LEDs. In contrast, initially-developed green LEDs were fabricated using GaP. Because GaP is an indirect transition material, there is degradation in efficiency. Thus, the green LEDs fabricated using this material could not practically produce a pure green light.

By virtue of the above-mentioned advantages and other advantages of GaN-based LEDs, the GaN-based LED market has rapidly grown. Also, techniques associated with GaN-based electro-optic devices have rapidly developed since the GaN-based LEDs became commercially available in 1994.

GaN-based LEDs have been developed to exhibit light emission efficiency superior over that of glow lamps. Currently, the efficiency of GaN-based LEDs is substantially equal to that of fluorescent lamps. Thus, it is expected that the GaN-based LED market will grow significantly.

Such an LED is packaged together with other elements. An example of an LED package is illustrated in FIGS. 1 and 2.

The illustrated LED package includes a silicon sub-mount 2, on which an LED 1 is mounted, an aluminum slug 3, a printed circuit board (PCB) 4, and an aluminum heat sink 5.

The silicon sub-mount 2 has metal lines formed on a flat silicon surface, for electrical connection with the LED 1.

The LED 1 is bonded to the sub-mount 2 using a flip chip bonding process. The sub-mount 2 is bonded to a mirror surface of the aluminum slug 3 using an adhesive.

Leads 6a are fixedly mounted to a package body 6. The leads are electrically connected to electrode metal portions of the sub-mount 2 via conductive wires 7, respectively.

The PCB 4 is bonded to the package body 6 using an adhesive, and includes metal lines 4a to which the leads 6a are attached using a welding process. The aluminum heat sink 5 is attached to the PCB 4, in order to allow heat from the PCB 4 to be outwardly discharged via the aluminum heat sink 5.

SUMMARY OF THE INVENTION

In the LED package having the above-mentioned structure, heat generated during operation of the LED is transferred to the aluminum heat sink 5 via the package body 6 and PCB 4. However, because the package body 6 and PCB 4 are made of a plastic material that exhibits low heat transfer rate, the heat discharge is degraded, and thus, the optical characteristics of the LED are also degraded.

In particular, it is difficult to implement an illumination apparatus such as a backlight, using LCD packages having the above-mentioned structure, due to problems associated with size, light uniformity, and costs. Also, degradation in productivity and reliability may occur because precise wire bonding may be required.

Accordingly, various embodiments of the present invention are directed to a sub-mount for mounting a light emitting device and a light emitting device package that substantially obviate one or more problems due to limitations and disadvantages of the related art.

An object of the present invention is to provide a sub-mount for mounting a light emitting device that enables emission of light having a uniform intensity of illumination from the light emitting device, and a light emitting device package that is capable of having uniform brightness, using the sub-mount.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method comprises: forming through holes in a substrate at a region where a light emitting device is to be mounted, forming electrodes at opposite major surfaces of the substrate such that the electrodes are connected by the through holes, and separating each electrode into portions of different polarities.

The method may further include forming an insulating layer on the substrate including the mount.

The method may further include a reflective layer having openings for connecting the light emitting device to the electrodes, respectively.

The method may further include coupling the electrodes to the light emitting device via the openings, coating an encapsulating material over the mount, to which the light emitting device is mounted, and bonding a lens to an upper surface of the encapsulating material.

The formation of the mount and the formation of the through holes may be simultaneously achieved by simultaneously etching both the opposite major surfaces of the substrate.

Preferably, the seed metal and electrodes are simultaneously separated into portions respectively corresponding to unit packages at the step of separating the electrodes.

The step of forming electrodes may comprise forming an adhesion layer on the seed metal, and forming an electrode metal layer on the adhesion layer.

The adhesion layer may be made of at least one of Ti, Cr, and Ta. The electrode metal layer may be made of at least one of Au, Cu, and Al.

The method may further include forming a diffusion barrier layer between the step of forming the adhesion layer and the step of forming the electrode metal layer. Preferably, the diffusion barrier layer is made of at least one of Pt and Ni.

The seed metal may be made of at least one of Au, Cu, and Al. The reflection layer may be made of Al or Ag.

The separation of the seed metal and electrodes may be achieved using at least one of a plating and etching method or a lift-off method.

The formation of the mount or through hole may be achieved using one of wet etching, dry etching, and laser drilling. In particular, the dry etching is preferably achieved using a deep RIE method.

In another aspect of the present invention, a sub-mount structure for mounting light emitting devices comprises: a substrate; a plurality of mounts formed on an upper surface of the substrate, and adapted to mount the light emitting devices; through holes respectively formed at opposite sides of each mount; electrodes, each extending to a lower surface of the substrate via an inner surface of an associated one of the mounts and an associated one of the through holes; and a reflective layer arranged on one of the electrodes arranged on the mount, the reflective layer having a recess to which the light emitting device is mounted.

In another aspect of the present invention, a light emitting device package comprises: a package body having a mount for mounting a light emitting device, and through holes; electrodes formed on the package body; and a reflective layer arranged on an upper one of the electrodes of the package body, the reflective layer having a recess to which the light emitting device is mounted.

The package body may comprise one of Si, Al, AlN, AlOx, photo sensitive glass (PSG), $Al_2O_3$, BeO, and PCB substrates. An insulating layer may be coated over the package body.

Each electrode may comprise an adhesion layer coupled to the seed metal, and made of at least one of Ti, Cr, and Ta, and an electrode metal layer arranged on the adhesion layer, and made of at least one of Au, Cu, and Al.

The light emitting device package may further comprise a diffusion barrier layer formed between the adhesion layer and the electrode metal layer, and made of at least one of Pt and Ni.

The seed metal may be made of at least one of Au, Cu, and Al.

The light emitting device package may further comprise a lateral reflector arranged over the mount, and adapted to enable light emitted from the light emitting device to be laterally discharged.

The lateral reflector may comprise a body having an opened side, and a groove communicating with the mount, and a reflective surface inclinedly formed at the groove.

It is to be understood that both the foregoing general description and the following detailed description of the present invention are exemplary and explanatory and are not intended to limit the scope of the claims.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIGS. 3 to 14 are sectional views illustrating a first embodiment of the present invention, in which:

FIG. 3 is a sectional view illustrating formation of a mask layer;

FIG. 4 is a sectional view illustrating patterning of the mask layer;

FIG. 5 is a sectional view illustrating formation of a mount and through holes;

FIG. 6 is a sectional view illustrating a state in which the mask layer has been removed;

FIG. 7 is a sectional view illustrating formation of an insulating layer;

FIG. 8 is a sectional view illustrating formation of a seed metal;

FIG. 9 is a sectional view illustrating an example of electrode formation;

FIG. 10 is a sectional view illustrating formation of electrodes;

FIG. 11 is a sectional view illustrating a state in which each electrode has been separated into electrode portions;

FIG. 12 is a sectional view illustrating formation of a reflective layer;

FIG. 13 is a sectional view illustrating formation using encapsulating material;

FIG. 14 is a sectional view illustrating formation of a lens;

DETAILED DESCRIPTION OF THE INVENTION

Figure 1:
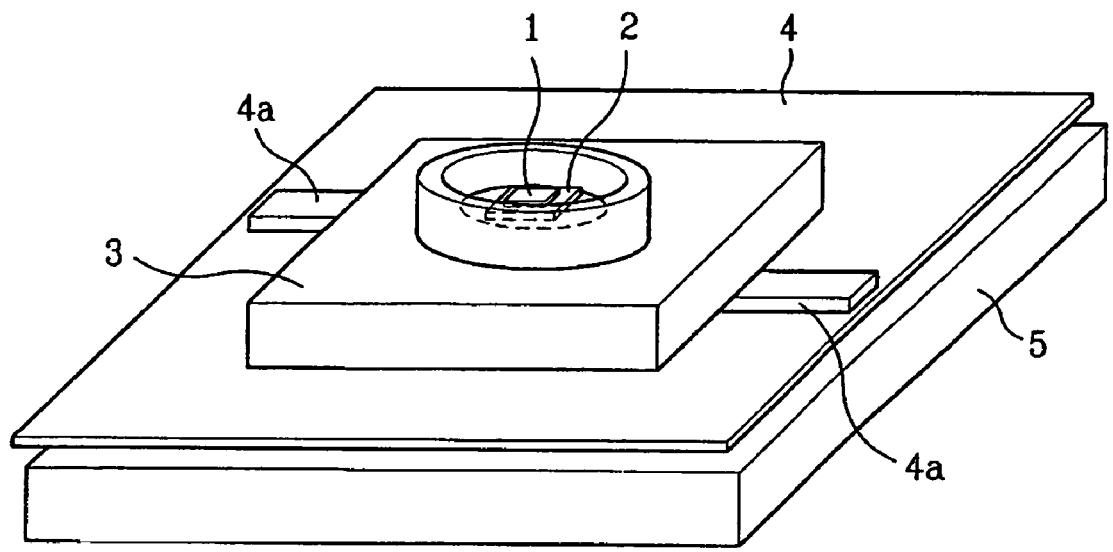
FIG. 1 is a perspective view illustrating an example of a conventional light emitting device package.
Figure 2:
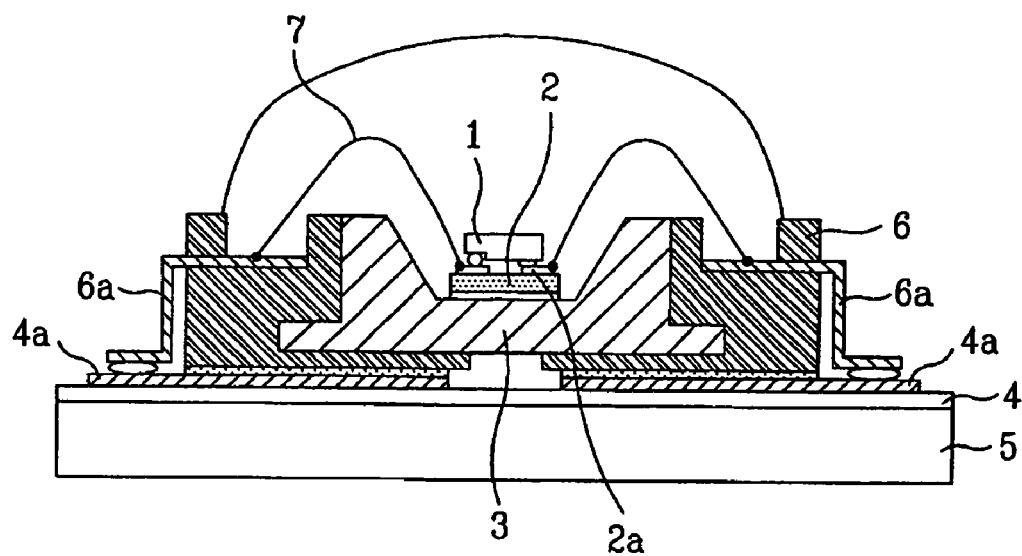
FIG. 2 is a sectional view illustrating the conventional light emitting device package.

The present invention now will be described more fully hereinafter with reference to the accompanying figures, in which embodiments of the invention are shown. This invention may, however, be embodied in many alternate forms and should not be construed as limited to the embodiments set forth herein. Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims.

Like numbers refer to like elements throughout the description of the figures. In the drawings, the thickness of layers and regions are exaggerated for clarity.

It will be understood that when an element such as a layer, region or substrate is referred to as being "on" another element, it can be directly on the other element or intervening elements may also be present. It will also be understood that if part of an element, such as a surface, is referred to as "inner," it is farther to the outside of the device than other parts of the element.

It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms.

Preferred embodiments of the present invention will be described, for example, with reference to a gallium nitride (GaN)-based light emitting diode (LED) formed on a non-conductive substrate such as a sapphire ($Al_2O_3$)-based substrate. However, the present invention is not limited to such a structure.

The embodiments of the present invention may employ other kinds of substrates including a conductive substrate. Therefore, the embodiments of the present invention may include AlGaInP LEDs on a GaP substrate, GaN LEDs on an SiC substrate, SiC diodes on a sapphire substrate, and/or any combination of nitride-based LEDs on GaN, SiC, AlN, ZnO and/or other substrates. Further, in the present invention, use of an active layer region is not limited to LED regions. In addition, other forms of the active layer region may be employed in compliance with some embodiments of the present invention.

First Embodiment

Formation of Mount and Through Holes

First, a procedure for forming a mount 11, for example, a recess-shaped or groove shaped mount, on which a light emitting device will be mounted, and through holes 12 and 13 will be described with reference to FIGS. 3 to 6.

Figure 3:
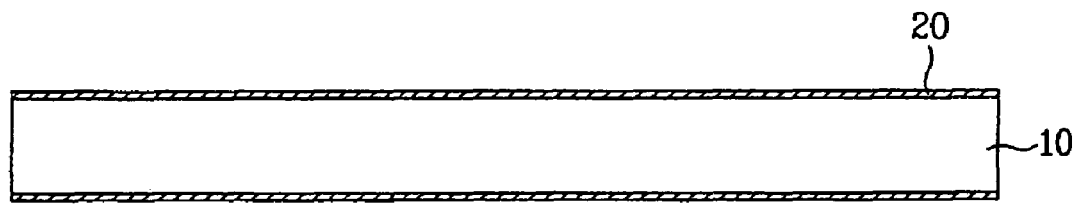

In this procedure, a substrate is first prepared, as shown in FIG. 3. The substrate 10 may include a silicon substrate, or substrates made of other materials, namely, aluminum, aluminum nitride (AlN), aluminum oxide (AlOx), photo sensitive glass (PSG), $Al_2O_3$, and BeO. The substrate 10 may be a PCB substrate.

Figure 4:
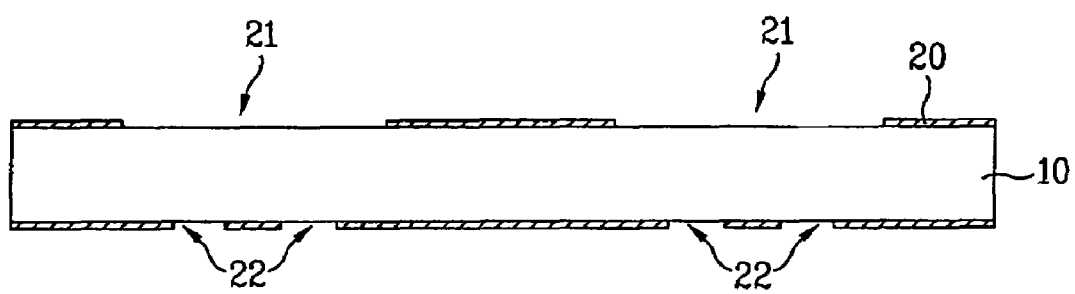

Mask layers 20 made of, for example, a photoresist material, are then formed over opposite major surfaces of the prepared substrate 10. Alternatively, a substrate, on which the mask layers 20 have previously been formed, may be prepared as the substrate 10. As shown in FIG. 4, the mask layers 20 are then patterned to form mask patterns required for bulk-etching of a region where a light emitting device will be mounted, namely, a region where the recess-shaped mount 11 will be formed, and regions where the through holes 12 and 13 will be formed.

Figure 5:
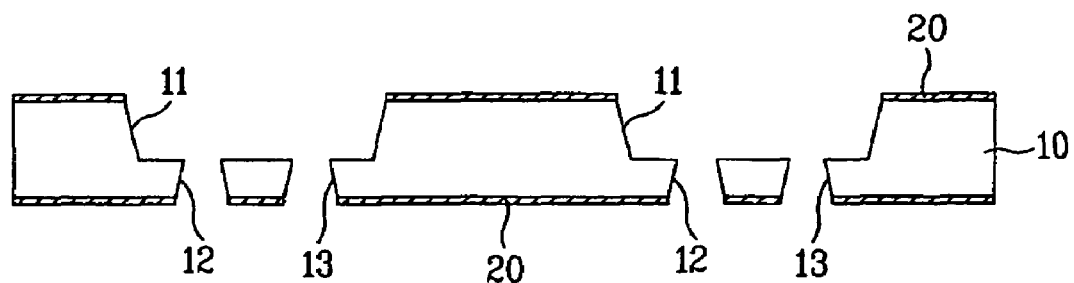

Thereafter, the recess-shaped mount 11 for mounting the light emitting device and through holes 12 and 13 are formed by bulk-etching (bulk-micromachining) the substrate 10, using the mask patterns of the mask layers 20, as shown in FIG. 5.

For the bulk-etching process, which is adapted to form the recess-shaped mount 11 and through holes 12 and 13, a wet etching process, a dry etching process, or a laser drilling process may be used.

A representative of the dry etching process may be a dip reactive ion etching process.

In this embodiment, the mount 11 and through holes 12 and 13 were formed at the substrate 10, using an isotropic wet etching solution such as KOH, tetramethyl ammonium hydroxide (THAH), or ethylene diamine pyrocatechol (EDP), under the condition in which a single-crystal silicon substrate having a [100] orientation is used for the substrate 10.

When the mount 11 is formed in accordance with the above-described method, it finally has an inclination of, ideally, 54.74°. Practically, the inclination of the mount 11 may be within a range of 50 to 60°.

The width and depth of the mount 11 depend on the size or thickness of the light emitting device to be mounted. The width and depth of the mount 11 is determined such that light emitted laterally from the light emitting device is most effectively used.

For the wet etching process for forming the mount 11 and through holes 12 and 13, the following two methods may be used.

In a first method, a region 21 where the light emitting device will be mounted and regions 22 where the through holes 12 and 13 will be formed are first patterned using masks. Thereafter, the regions 21 and 22 are simultaneously wet-etched to form the mount 11 and through holes 12 and 13.

The mount 11 and through holes 12 and 13 may be formed using a silicon bulk micromachining process.

In a second method, a mask patterning process is first carried out for the region 21 where the light emitting device will be mounted or the regions 22 where the through holes 12 and 13 will be formed. Thereafter, an etching process is carried out for the mask-patterned region 21 or regions 22. During this etching process, a mask patterning process is carried out for the remaining region 21 or regions 22. After this mask patterning process, the remaining region 21 or regions 22 are etched. In this case, it is possible to adjust the ratio between the depth of the mount 11 and the depth of the through holes 12 and 13.

In order to define a portion of the substrate 10 to be etched and a portion of the substrate 10 to be protected from an etching process, the mask layers 20 are provided. The mask layers 20 should be made of a material capable of exhibiting a mask function for a prolonged period of time in an etching process. For the mask layers 20, a silicon nitride film or a silicon oxide film is mainly used.

The through holes 12 and 13 function to electrically connect front electrodes formed at the side of the mount 11 and rear electrodes formed at the opposite side of the mount 11. In order to separate the electrodes into two polarities, namely, a positive polarity and a negative polarity, it is preferred that the through holes 12 and 13 are formed independently of each other such that the through hole 12 connects the positive electrodes, whereas the through hole 13 connects the negative electrodes.

<Formation of Electrodes and Reflective Layer>

Figure 7:
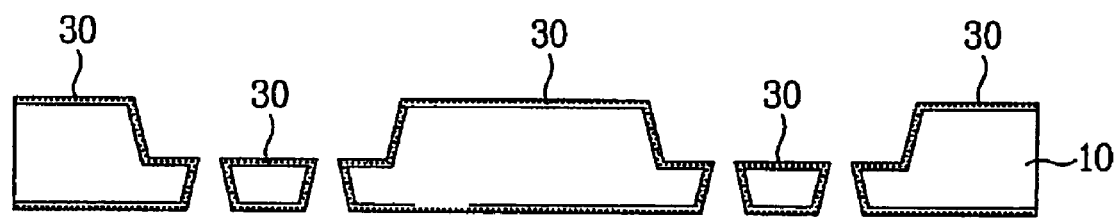

Next, an insulating layer 30 is formed over the overall surface of the substrate 10 including the mount 11 and through holes 12 and 13, for electrical insulation of the substrate 10, as shown in FIG. 7.

Figure 6:
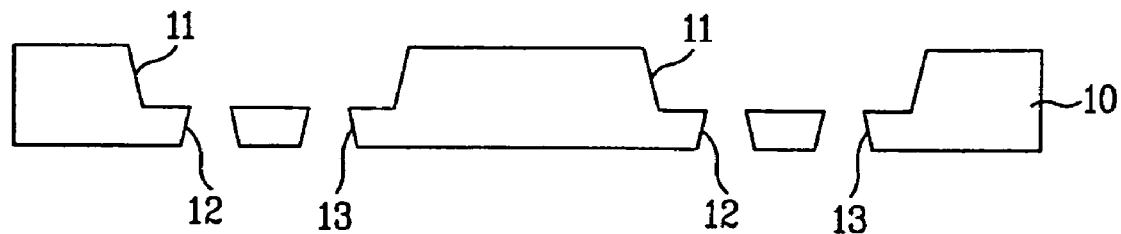

For the formation of the insulating layer 30, the mask layer 20, which was used for the formation of the mount 11 and through holes 12 and 13, is first removed, as shown in FIG. 6. A silicon oxide film exhibiting excellent insulation characteristics is formed over the overall surface of the substrate 10 in accordance with a thermal oxidation method.

A silicon nitride film may be deposited for the insulating layer 30, using an insulating layer formation method other than the above-described method, for example, a low pressure chemical vapor deposition (LPCVD) method or a plasma enhanced chemical vapor deposition (PECVD) method.

The insulating layer 30 may be dispensed with in the case in which the substrate 10 is made of an insulating material such as an aluminum nitride (AlN) or an aluminum oxide (AlOx).

Thereafter, electrodes 50 including front electrodes 50a and rear electrodes 50b are formed on the substrate 10, which has a three-dimensional structure including the mount 11 for mounting a light emitting device, and the through holes 12 and 13, in accordance with a patterning process.

For the method for forming the electrodes 50 using a patterning process, the following three methods may be used.

The first method is a method using electroplating.

Figure 8:
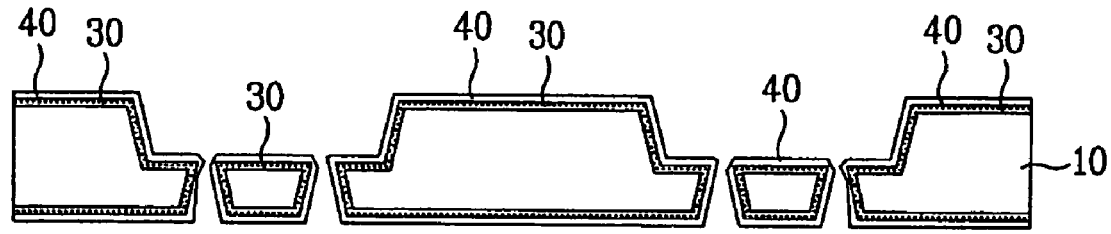

In this method, a seed metal 40 is first deposited on both major surfaces, namely, front and rear surfaces, of the substrate 10 which has a three-dimensional structure formed with the insulating layer 30 after the formation of the mount 11 and through holes 12 and 13, as shown in FIG. 8. In this case, the seed metal 40 may be deposited on the surfaces of the through holes 12 and 13.

Thereafter, the electrodes 50, which include the front and rear electrodes 50a and 50b, are formed on the seed metal 40 in accordance with an electroplating method or an electroless-plating method.

Figure 10:
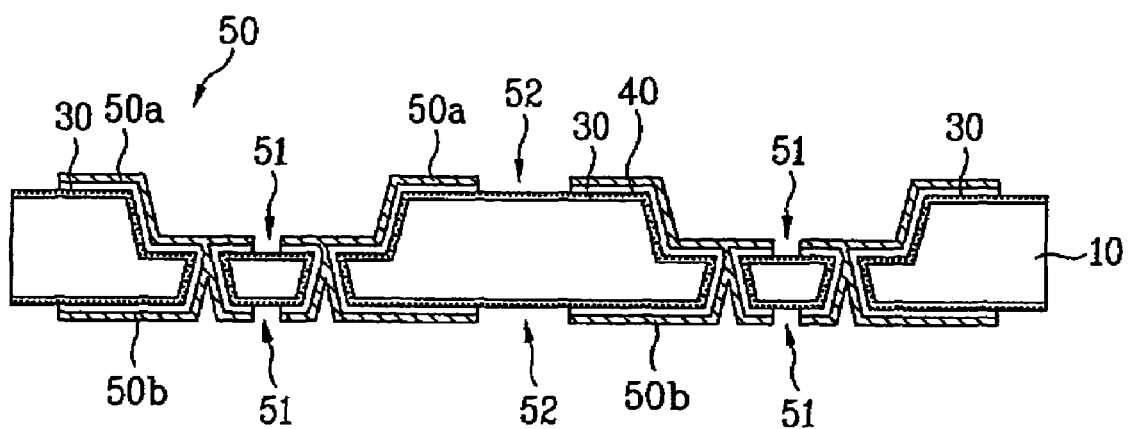

Subsequently, photoresist coating, light exposure, and development are sequentially carried out, to etch the electrodes 50 such that the electrodes 50 are separated into positive and negative electrodes along separation grooves 51. A patterning process is then carried out to connect the front electrodes 50a and the rear electrodes 50b via the through holes 12 and 13, respectively. Thus, an electrode structure as shown in FIG. 10 is completely formed.

The electrode formation may be achieved by patterning the photoresist before the formation of the electrodes 50, forming the electrodes 50 in accordance with a plating method, removing the photoresist, and etching the seed metal 40, to separate the positive and negative electrodes from each other.

At this time, etching may also be carried out for the boundaries of the unit packages along singulation or dicing regions 52. In this case, it is possible to achieve an easy dicing process, or to prevent electric leakage after the dicing of the unit packages.

The second method is a method using lift-off.

Figure 9:
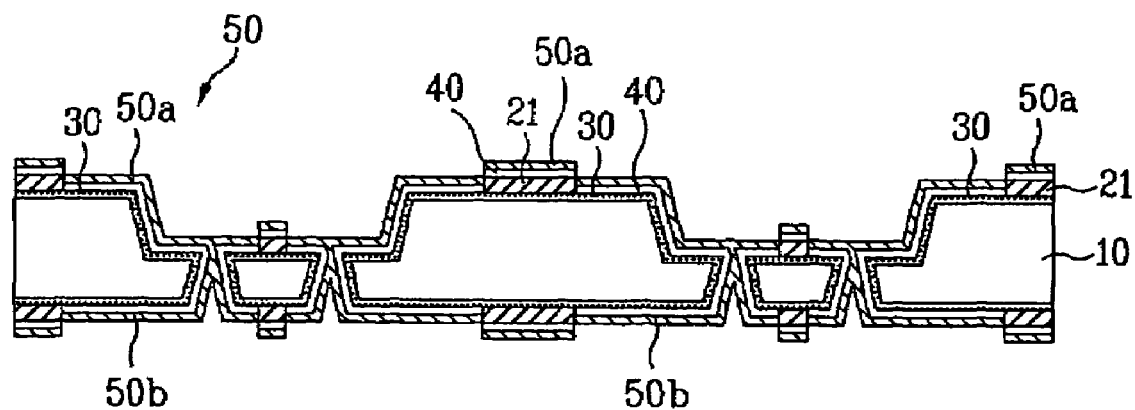

In this method, a photoresist 21 is first coated over the front and rear surfaces of the substrate 10, as shown in FIG. 9. Light exposure and development are then carried out, to separate the substrate 10 into portions respectively corresponding to positive and negative electrodes, and to separate the substrate 10 into portions respectively corresponding to unit packages.

An electrode metal for the formation of the electrodes 50 is then deposited on the first and rear surfaces of the substrate 10 including the through holes in accordance with a sputtering method or an E-beam evaporation method. Thus, the structure as shown in FIG. 9 is obtained.

Figure 11:
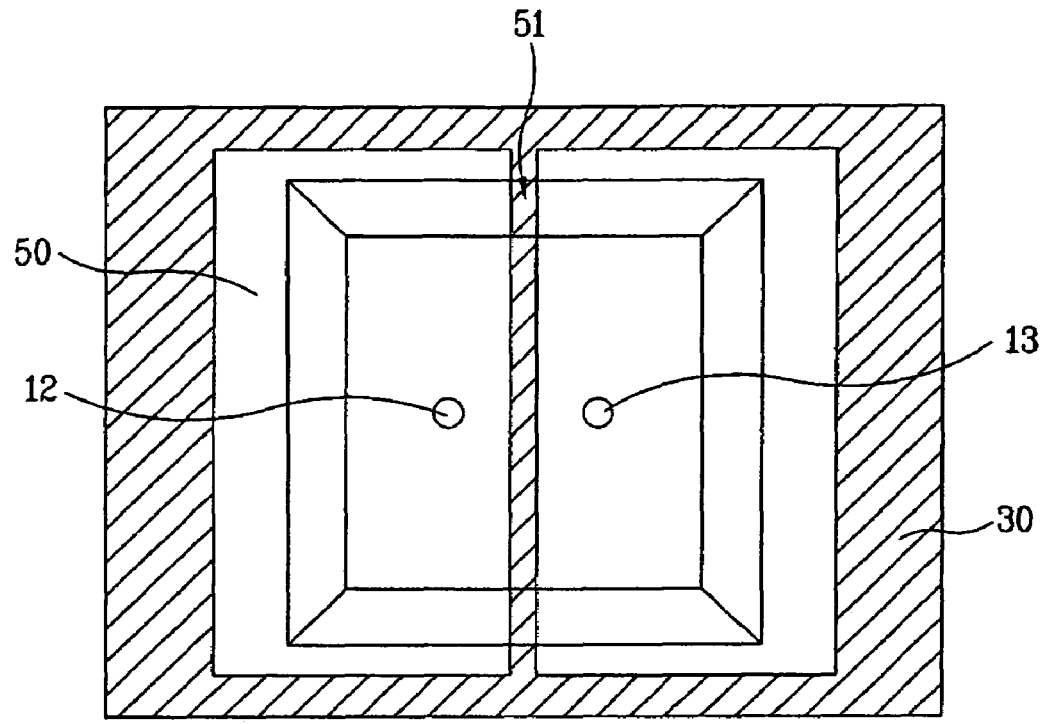
Figure 12:
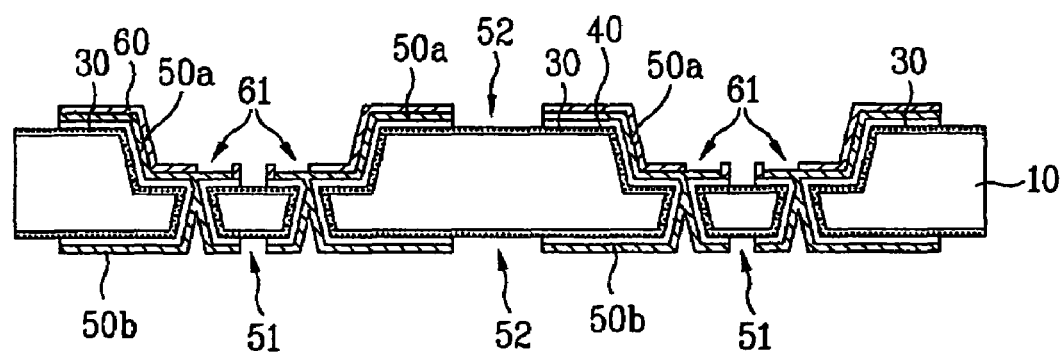

The photoresist 21 is then lifted off. In accordance with the lift-off of the photoresist 21, the portions of the electrodes 50 on the photoresist 21 are removed. Thus, the electrodes 50 are separated into positive and negative electrodes as shown in FIG. 11. At this time, the substrate 10 is also separated into portions respectively corresponding to unit packages.

In order to increase the thickness of the electrodes 50, an additional metal layer may be formed on the electrodes 50 in accordance with electroplating or electroless-plating.

The third method is a combination of lift-off and electroplating.

In this method, the front electrodes 50a or rear electrodes 50b are formed on the associated front or rear surface of the substrate 10 in accordance with the above-described lift-off method.

In accordance with an electroplating or electroless-plating method, electrodes are then formed on the surface of the substrate 10 opposite to the electrodes formed using the lift-off method. Thereafter, the front electrodes 50a and rear electrodes 50b are electrically connected via the through holes.

In this case, the metal of the electrodes 50 should exhibit superior electrical characteristics, and a superior adhesion force to the insulating layer. For an adhesion layer of the electrode metal, generally, titanium (Ti), chromium (Cr), or tantalum (Ta) exhibiting a superior adhesion force to a silicon oxide film, which is mainly used as an insulating layer, may be used.

Gold (Au), copper (Cu), or aluminum (Al) may be used which is a representative electrode metal exhibiting superior electrical characteristics while being easily depositable in a semiconductor process.

The electrode metal is exposed to a high temperature condition in a subsequent procedure, in particular, a process for coupling module elements. For this reason, Ti or Cr, which is the material of the adhesion layer, may be diffused into Au, thereby degrading the electrical characteristics of Au. To this end, a diffusion barrier layer made of, for example, platinum (Pt) or nickel (Ni), may be interposed between the adhesion layer of Ti or Cr and the Au layer.

Thus, the electrodes 50 may have a structure of Ti/Pt/Au, Cr/Ni/Au, or Cr/Cu/Ni/Au.

Where the electrode metal layer of the electrodes 50 is formed using the electroplating method, it is preferable to form the seed metal 40. Similarly to the electrode metal layer of the electrode 50, the seed metal 40 should exhibit superior electrical characteristics, and a superior adhesion force to the insulating layer 30.

For an adhesion layer of the electrode metal, titanium (Ti), chromium (Cr), or tantalum (Ta) is used. For the seed metal, gold (Au), copper (Cu), or aluminum (Al) is used. Accordingly, a structure of Cu/Au, Cr/Cu, Ti/Au, or Ta/Ti/Cu may be formed.

Thus, the electrodes 50 may form a structure of Cr/Cu/Cu/Ni/Au, Cr/Au/Au, or Cr/Au/Cu/Ni/Au, together with the seed metal 40.

After the formation of the electrode 50, a reflective layer 60 is formed on the bottom and inclined surfaces of the mount 11, in order to achieve an enhancement in the efficiency of light emitted from the light emitting device mounted on the mount 11.

The reflective layer 60 may be made of a material exhibiting a superior reflectivity, such as aluminum (Al) or silver (Ag).

The formation of the reflective layer 60 may be achieved by coating a photoresist over the overall surface of the substrate 10, patterning the coated photoresist in accordance with light exposure and development such that the bottom or inclined surface of the mount 11, on which the light emitting device will be mounted, is exposed, depositing a reflective material in accordance with a sputtering method or an E-beam evaporation method, and lifting off the patterned photoresist.

Alternatively, the reflective layer 60 may be formed by depositing a reflective material over the overall surface of the substrate 10, and then etching unnecessary portions of the deposited reflective material.

The reflection layer 60 should be formed to prevent it from being connected to or overlapped with both the positive and negative ones of the electrodes 50a and 50b, in order to prevent electrical short-circuit. In order to enable the reflection layer 60 to adhere to the electrode metal, it is preferred that the reflective layer 60 is not present on the reflection layer 60 at regions where solderings or Au studs 71 (FIG. 13) will be formed.

<LED Bonding and Packaging>

Figure 13:
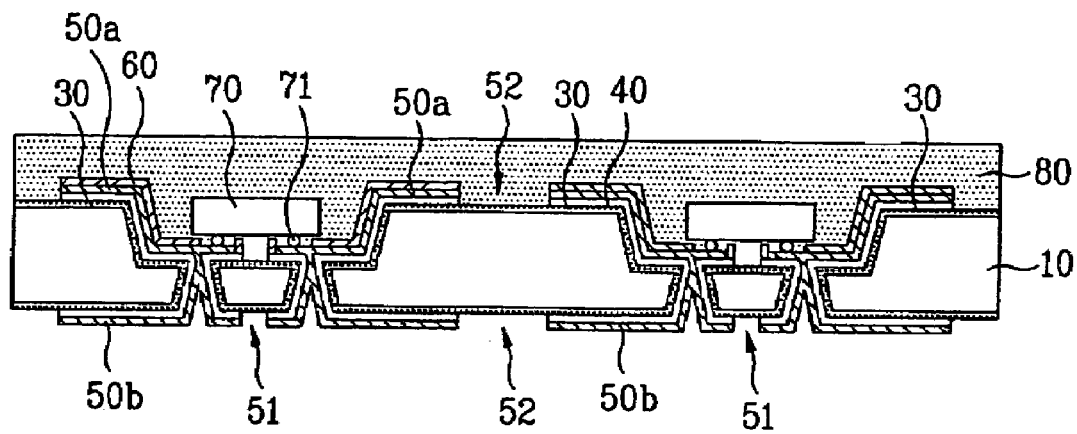

Next, a light emitting device 70 such as an LED is bonded to the front electrodes 50a, in accordance with a bonding method using solderings or Au studs, such that the light emitting device 70 is electrically connected to the front electrodes 50a, as shown in FIG. 13. At this time, the light emitting device 70 is mounted on the mount 11. An encapsulating material 80, which is made of phosphor, silicon gel, or epoxy resin having superior optical transmittance, is then filled in the mount 11.

That is, when a transfer molding process is carried out after the bonding of the light emitting device 70 to the substrate 10, the encapsulating material 80 is applied over the substrate 10 such that it encloses the light emitting device 70.

The transfer molding process is carried out under the condition in which a tape is attached to a lower surface of the substrate 10, in order to prevent the encapsulating material 80 from being attached to the electrodes 50, and thus, contaminating the electrodes 50.

It is possible to vary the wavelength of light emitted from the light emitting device 70 when the encapsulating material 80 is made of a molding composite resin in which phosphor powder is dispersed.

For example, where the light emitted from the light emitting device 70 is blue light, and the phosphor powder is green and red phosphor powder, the blue light emitted from the light emitting device 70 and incident to the green and red phosphor powder dispersed in the encapsulating material 80 is outwardly emitted after being wavelength-varied to green light and red right. In this case, the blue light emitted from the light emitting device 70, but not incident to the green and red phosphor powder dispersed in the encapsulating material 80, is outwardly emitted as is. As a result, white light, which is a combination of the blue light, green light, and red light, is outwardly emitted.

Thus, light sources capable of emitting light of various wavelengths including a white light source can be implemented.

Accordingly, it is preferred that the phosphor powder comprise one or two of blue phosphor powder, green phosphor powder, red phosphor powder, and yellow phosphor powder.

The filling of the encapsulating material 80 may be carried out after the substrate 10 is diced into portions respectively corresponding to unit packages, namely, sub-mount units. Alternatively, the filling of the encapsulating material 80 may be carried out before the dicing of the substrate 10. In this case, light emitting devices 70 for respective unit packages are first bonded to the substrate 10. The encapsulating material 80 is then filled on the substrate 10. Thereafter, the substrate 10 is diced into portions respectively corresponding to unit packages, namely, sub-mount units.

The solderings for bonding of the light emitting device 70 may be performed, using gold-tin (AuSn), lead-tin (PbSn), or indium (In), in accordance with an E-beam evaporation method.

Figure 14:
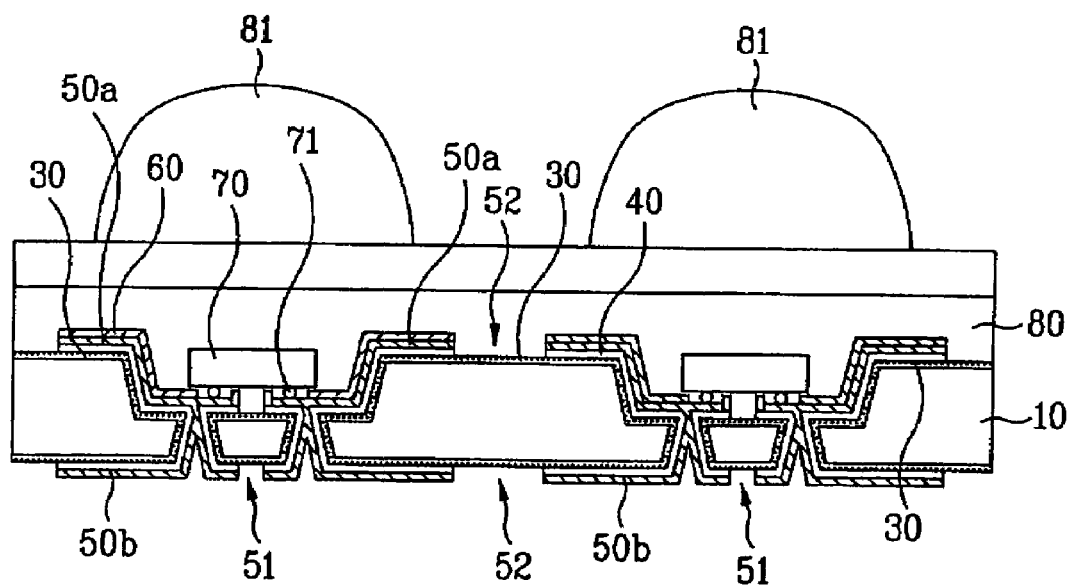

If necessary, a lens sheet having a predetermined shape may then be bonded to or formed on the substrate 10, to form a lens 81 for controlling the distribution of light emitted from the light emitting device 70, as shown in FIG. 14.

In this case, an encapsulating material 80 may be partially or completely applied on the surface of the lens sheet opposite to the surface formed with the lens 81, using silicon gel containing phosphor or epoxy resin having superior optical transmittance, in accordance with a screen printing method. Thus, it is possible to fabricate the lens 81 using a lens sheet having a lens structure at one surface and an encapsulating material containing phosphor at the other surface.

The lens sheet having the above-described structure may be subsequently bonded to the substrate 10 carrying the light emitting device 70, in accordance with a laminating process. The resultant package may then be diced into unit packages.

Hereinafter, various other embodiments of the present invention will be described with reference to the annexed drawings. Elements of each embodiment, not described, may be similar to those of the first embodiment.

Second Embodiment

Figure 15:
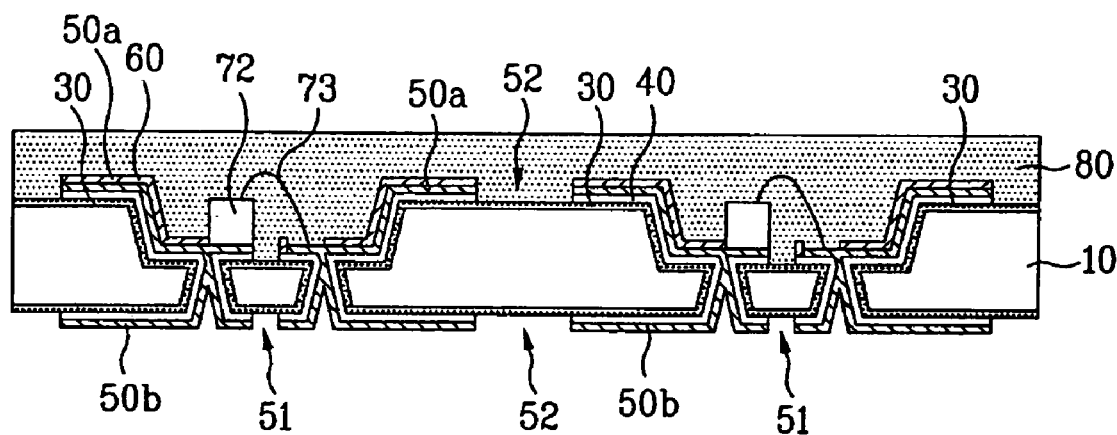
FIG. 15 is a sectional view illustrating a second embodiment of the present invention.

FIG. 15 illustrates an embodiment in which a light emitting device 72 is bonded to the substrate 10 in accordance with a wire bonding process using wires 73, differently from the case of FIG. 14.

In particular, where a vertical light emitting device 72 having electrodes at the top and bottom thereof is used, the lower electrode of the light emitting device 72 is bonded to one of the front electrodes 50a via a wire 73, whereas the upper electrode of the light emitting device 72 is bonded to the other front electrode 50a having a polarity opposite to that of the one-side front electrode 50a via a wire 73.

The remaining fabrication processes and structures of this embodiment are similar to those of the first embodiment.

Third Embodiment

Figure 16:
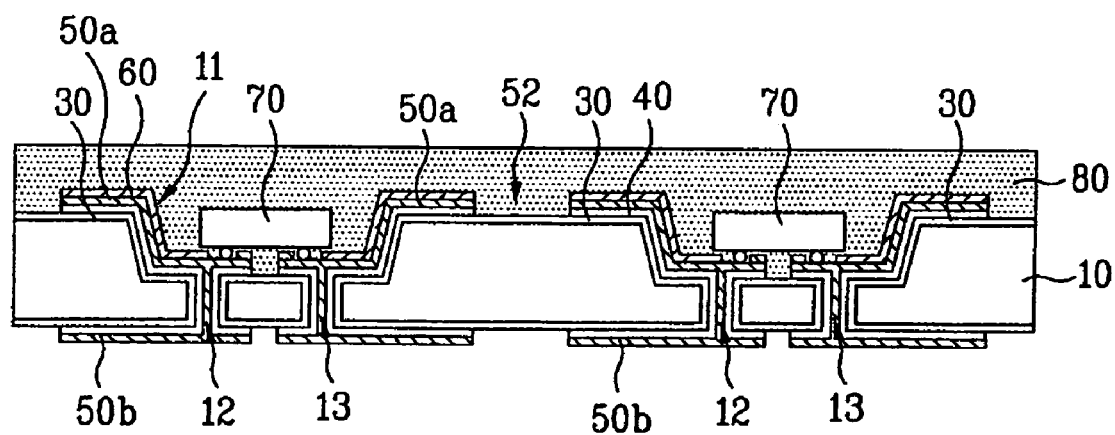
FIG. 16 is a sectional view illustrating a third embodiment of the present invention.

FIG. 16 illustrates a structure in which the mount 11 or each through hole 12 or 13 of the light emitting device 70 has a vertical surface in accordance with a third embodiment of the present invention.

In accordance with this embodiment, the mount 11 or each through hole 12 or 13 may be formed to have a vertical surface other than an inclined surface, in accordance with a laser drilling method or a deep-RIE method.

The mount 11 or each through hole 12 or 13 having a vertical surface can be formed in accordance with a wet etching method under the condition in which a silicon substrate having a [110] orientation is used for the substrate 10.

When the through holes 12 and 13 have vertical surfaces, respectively, it is possible to more easily enable the front electrode 50a and rear electrode 50b to come into contact with each other via the through holes 12 and 13.

Fourth Embodiment

Figure 17:
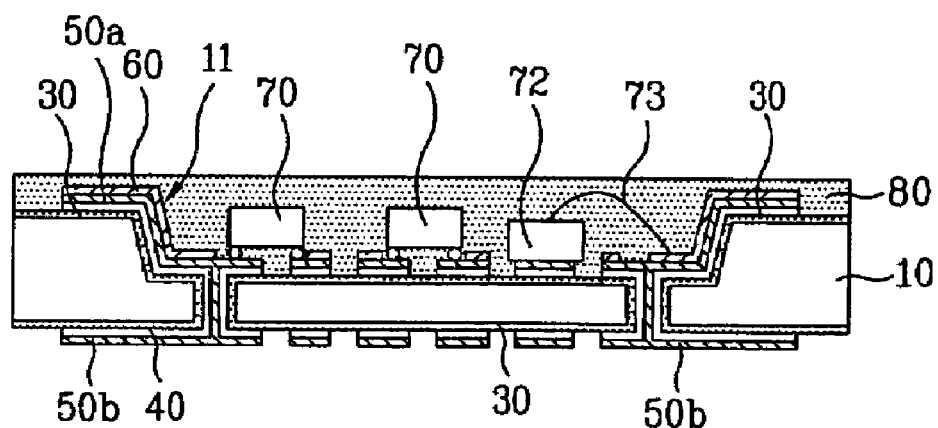
FIG. 17 is a sectional view illustrating a fourth embodiment of the present invention.

Referring to FIG. 17, a light emitting device package including one or more light emitting chips, for example, red, green, and blue light emitting chips, is illustrated.

In accordance with a fourth embodiment of the present invention, the electrodes 50 and seed metal 40, and reflective layer 60, which correspond to one unit package, may be formed such that they are separated into portions respectively corresponding to regions where light emitting devices 70 and 72 will be mounted. In this case, a plurality of light emitting devices 70 and 72 can be bonded to the substrate 10 at a region corresponding to one unit package.

When red, green, and blue light emitting devices are mounted to one unit package, it is possible to implement one white light emitting device package.

In this case, at least one light emitting device emitting one of primary color lights, namely, red, green and blue lights, may be included in the unit package.

Fifth Embodiment

Figure 18:
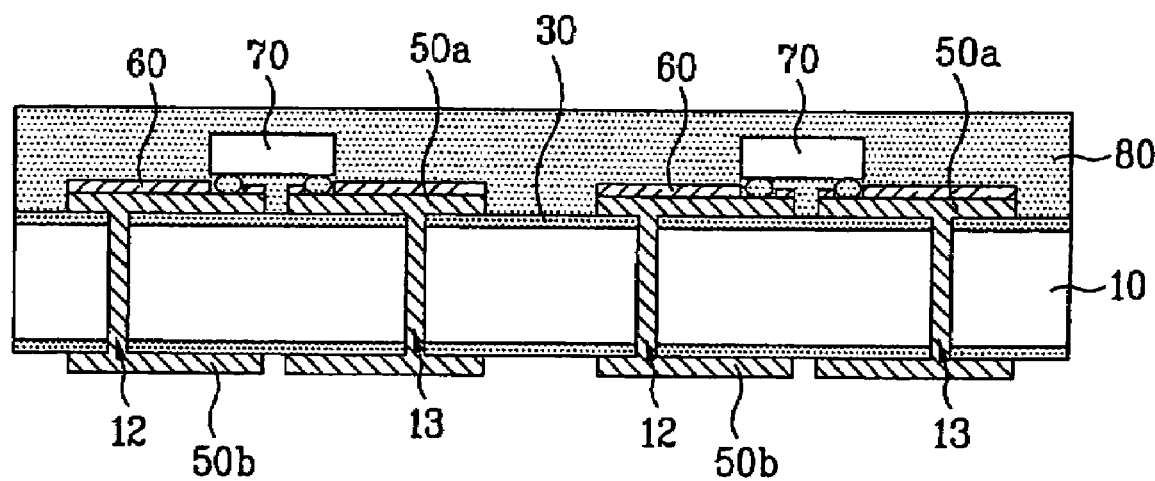
FIG. 18 is a sectional view illustrating a fifth embodiment of the present invention.

FIG. 18 illustrates an embodiment wherein a light emitting device package is formed, in which the substrate 10 is formed with only the through holes 12 and 13, without having any mount for the light emitting device 70.

In this case, it is possible to simplify the fabrication process by virtue of no formation of the mount.

In this case, it is also possible to reduce the thickness of the light emitting device package. When the electrodes 50a and 50b are formed in accordance with a lift-off method, in this case, the formation of the seed metal 40 may be dispensed with.

Sixth Embodiment

Figure 19:
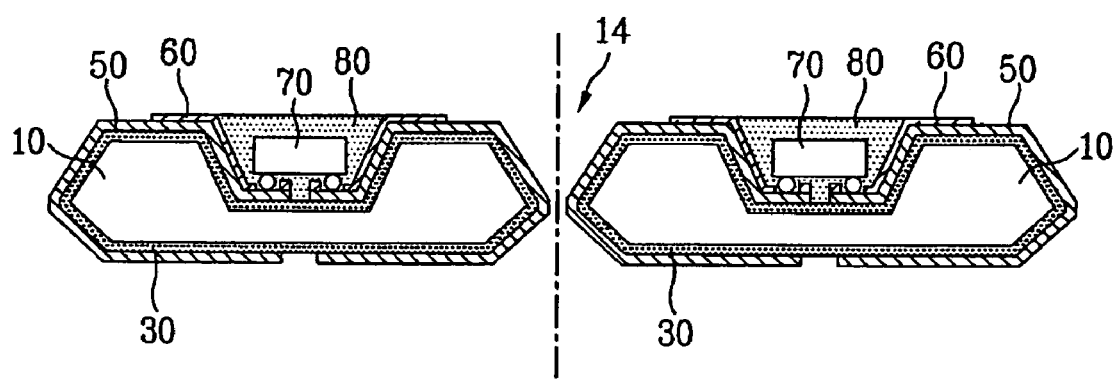
FIG. 19 is a sectional view illustrating a sixth embodiment of the present invention.

As shown in FIG. 19, it is possible to form the through holes along the side wall of the substrate without forming the through holes at the top portion of the substrate or at the mount.

That is, in accordance with a sixth embodiment of the present invention, through holes 14 may be formed along a dicing region corresponding to the boundary of adjacent unit packages. In this case, a package having a three-dimensional structure is fabricated.

Since the through holes 14 are formed along the dicing region, it is possible to more easily achieve the dicing of the fabricated package into unit packages.

In this case, the electrodes 50 are electrically connected via the through holes 14.

Seventh Embodiment

Figure 20:
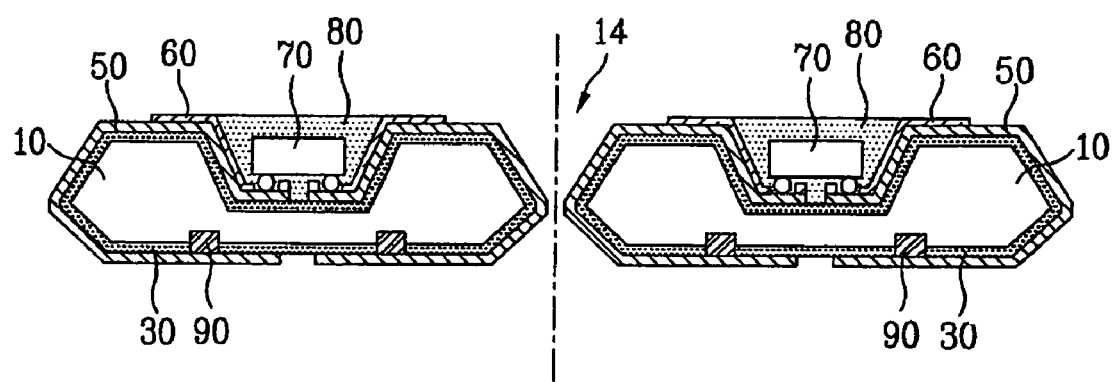
FIG. 20 is a sectional view illustrating a seventh embodiment of the present invention.

In accordance with a seventh embodiment of the present invention, it is possible to embed zener diodes 90 in the substrate 10 under the condition in which a silicon substrate is used for the substrate 10, as shown in FIG. 20.

The embedding of the zener diodes 90 may be achieved using one of the following methods.

The first method is to implant P-type dopant ions such as boron ions into an N-type substrate.

The second method is to implant N-type dopant ions such as $PoCl_3$ ions into a P-type substrate 10.

For example, the first method is adapted to form a semiconductor PNP junction structure by doping boron ions into the substrate 10 at a region where N and P-type electrodes come into contact with each other, such that the N and P-type electrodes are electrically connected.

In accordance with such a structure of the zener diodes 90, current is bypassed by the zener diodes 90 when an overvoltage is applied to the light emitting device 70 due to static electricity. Accordingly, it is possible to prevent the light emitting device 70 from being damaged.

It is preferred that the silicon substrate used in association with the formation of the zener diodes 90 have a resistance of 0.01 to 1.0 Ohm/cm.

Figure 21:
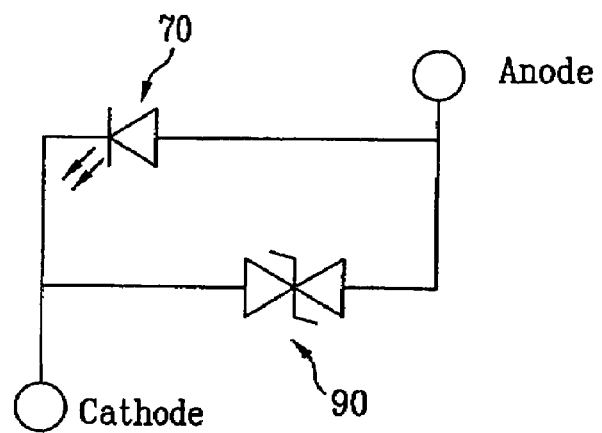
FIG. 21 is a circuit diagram illustrating the seventh embodiment of the present invention.

FIG. 21 is a circuit diagram of the light emitting device package in which the zener diodes 90 are embedded as described in FIG. 20.

Figure 22:
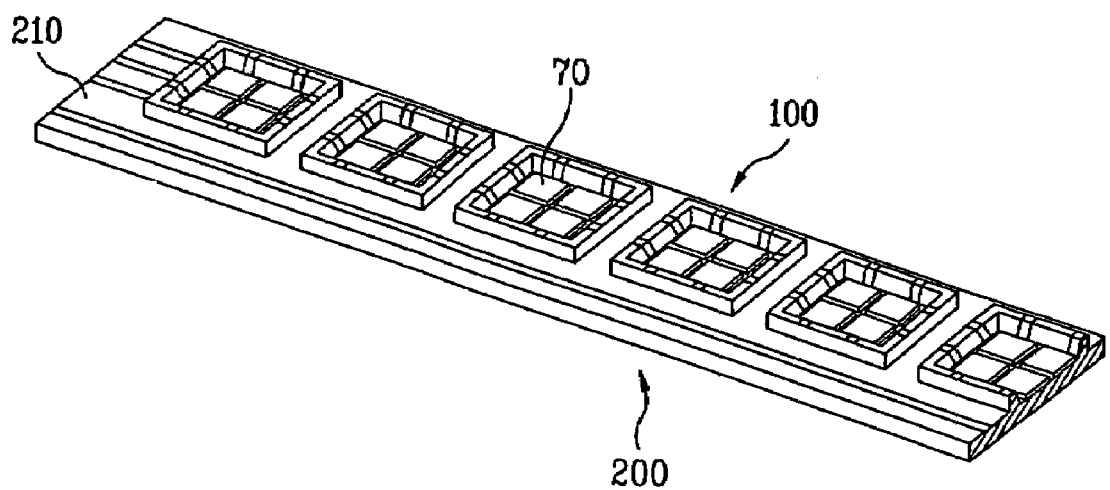
FIG. 22 is a perspective view illustrating an example of an illumination apparatus to which embodiments of the present invention can be applied.

Referring to FIG. 22, a light emitting device package 100 is illustrated which may be fabricated in accordance with one of the above-described embodiments as illumination apparatuses for various purposes using light emitting devices. As shown in FIG. 22, the light emitting device package 100, which is of a sub-mount type, is bonded to a system formed with an electrode line 210 for supplying electric power to the light emitting device of the package 100.

FIG. 22 illustrates the case in which a plurality of light emitting devices 70 are mounted to one package 100.

For example, a combination of red, green and blue light emitting devices 70 is incorporated in one package 100, to implement an illumination device emitting white light or various other lights.

Eighth Embodiment

Figure 23:
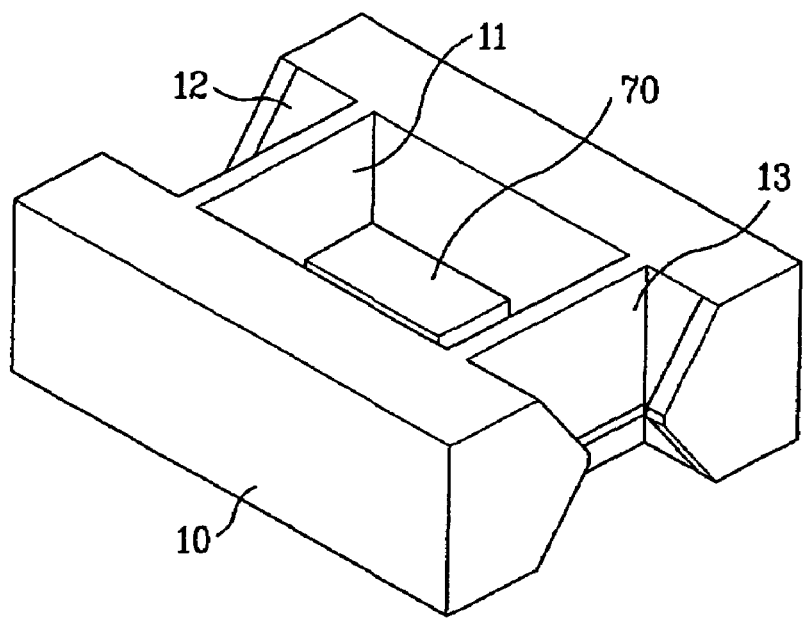
FIG. 23 is a perspective view illustrating an example of a light emitting device package according to an embodiment of the present invention.

The mounted state of one light emitting device 70 to the substrate 10 may be as illustrated in FIG. 23.

Referring to FIG. 23, an example of a package is illustrated wherein a light emitting device 70 is mounted to a substrate 10 at a region where a mount 11 is formed, and through holes 12 and 13 having an inclined structure are formed at opposite sides of the mount 11, respectively.

Figure 24:
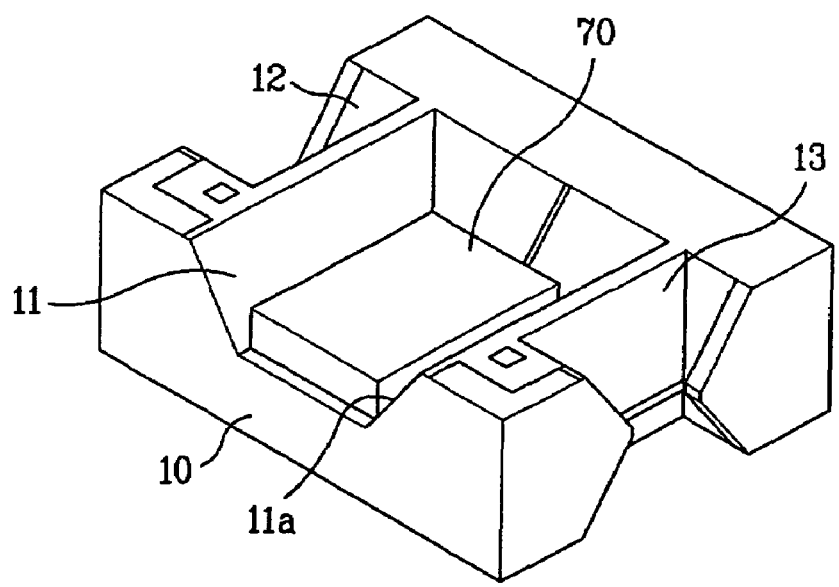
FIG. 24 is a perspective view illustrating another example of the light emitting device package according to an embodiment of the present invention.

As shown in FIG. 24, at least one of the side walls of the mount 11, for example, the side wall 11a, may be laterally opened, in order to enable lateral light emission.

Figure 25:
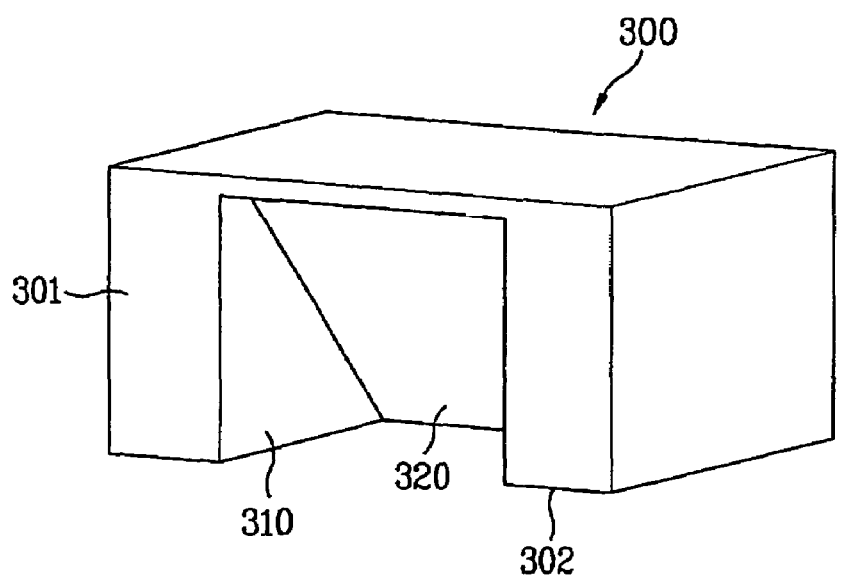
FIG. 25 is a perspective view illustrating an example of a lateral reflector according to an eighth embodiment of the present invention.

In order to achieve an enhancement in the efficiency of lateral light emission in the light emitting device package having the above-described structure, a lateral reflector 300 may be provided, as shown in FIG. 25.

The lateral reflector 300 is adapted to enable light emitted from the light emitting device 70 to be laterally discharged.

As shown in FIG. 25, the lateral reflector 300 is formed with a groove 310 at one side surface 301, and is opened at a portion of a bottom surface 302, to communicate with the mount 11.

An inclined surface 320 is formed at one surface of the groove 310, in order to enable the light emitted from the light emitting device 70 to be efficiently laterally discharged. The inclination of the inclined surface 320 is preferably 45°.

A reflective surface may be formed on the inclined surface, using a mirror coating method or the like.

Figure 26:
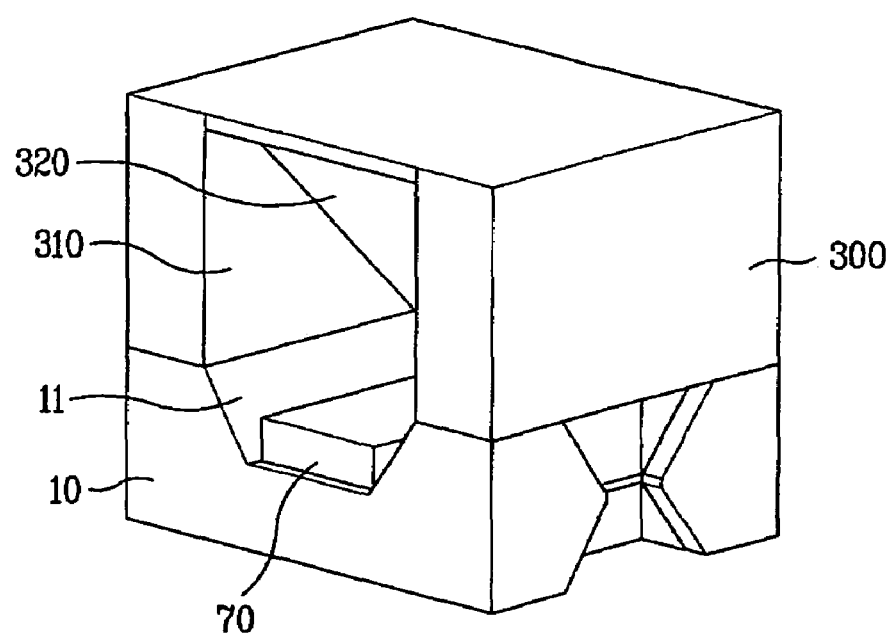
FIG. 26 is a perspective view illustrating a state in which the lateral reflector according to an embodiment of the present invention is mounted to a light emitting device package.

FIG. 26 is a perspective view illustrating a state in which the lateral reflector 300 of FIG. 25 is mounted to the top of the light emitting device package. As shown in FIG. 26, the lateral reflector 300 is mounted to the substrate 10 of the light emitting device package such that the groove 310 of the lateral reflector 300 communicates with the mount 11 of the substrate 10.

By virtue of the lateral reflector 300, light emitted from the light emitting device 70 mounted in the package is more effectively discharged from the associated side surface of the package.

Figure 27:
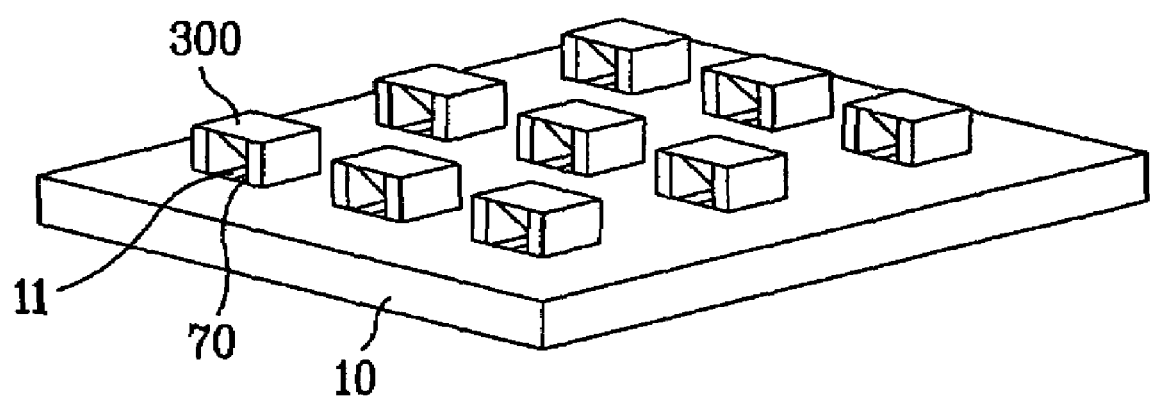
FIG. 27 is a perspective view illustrating an example of an illumination apparatus using the lateral reflector according to an embodiment of the present invention.

FIG. 27 illustrates a state in which a plurality of light emitting device packages having lateral reflectors 300 are arranged in the form of a matrix in accordance with an embodiment of the present invention.

Thus, a package capable of laterally emitting light can be implemented by mounting lateral reflectors 300 to the substrate 10 on which light emitting devices are mounted.

It will be apparent to those skilled in the art that various modifications and variations can be made in the present invention without departing from the spirit or scope of the inventions. Thus, it is intended that the claims cover the modifications and variations of this invention if they come within the scope of the appended claims and their equivalents.

What is claimed is:

1. A light emitting device package comprising:
a package body having a mount for mounting a light emitting device, and through holes;
a seed metal layer formed on the package body;
electrodes formed on the seed metal layer, the electrodes connected with the light emitting device electrically, wherein the electrodes comprise an adhesion layer, an electrode metal, and a diffusion barrier layer that is between the adhesion layer and the electrode metal; and
a reflective layer arranged on the electrodes, the reflective layer having at least one opening.

2. The light emitting device package according to claim 1, wherein the reflective layer comprises Al or Ag.

3. The light emitting device package according to claim 1, further comprising:
a zener diode formed on the package body and electrically connected to the mount.

4. The light emitting device package according to claim 3, wherein the zener diode comprises a diffusion layer formed on the package body such that the diffusion layer is in contact with one of the electrodes, the diffusion layer having a polarity different from the polarity of the package body.

5. The light emitting device package according to claim 1, wherein the light emitting device comprises a plurality of light emitting devices mounted on the mount.

6. The light emitting device package according to claim 5, wherein three or four light emitting devices are mounted on the mount.

7. The light emitting device package according to claim 5, wherein each of the light emitting devices emits red, green, or blue light.

8. The light emitting device package according to claim 1, wherein the seed metal is deposited on the surfaces of the through holes.

9. The light emitting device package according to claim 1, wherein the seed metal is to assist formation of electrodes on the package body.

10. The light emitting device package according to claim 1, wherein the seed metal is deposited on front and rear surfaces of the package body.

11. The light emitting device package according to claim 1, wherein the diffusion barrier layer comprises at least one of Pt and Ni.

12. A light emitting device package comprising:
a package body comprising at least one of semiconductor substrate, substrate comprising at least one of aluminum nitride, aluminum oxide, photo sensitive glass, $Al_2O_3$, BeO, and PCB substrate;
an insulating layer coated over the sides of the package body;
a mount for mounting a light emitting device, the mount formed on the package body;
electrodes formed on the insulating layer connected to the bottom of the package body via the sides of the package body, the electrodes connected with the light emitting device electrically, wherein the electrodes comprise an adhesion layer on the insulating layer, an electrode metal, and a diffusion barrier layer that is between the adhesion layer and the electrode metal.

13. The light emitting device package according to claim 12, further comprising:
a zener diode electrically connected to the mount.

14. The light emitting device package according to claim 12, wherein the mount is formed on the upper surface of the package body.

15. The light emitting device package according to claim 12, further comprising
a reflective layer arranged on the electrodes.

16. The light emitting device package according to claim 12, wherein the light emitting device comprises a plurality of light emitting devices mounted on the mount.

17. The light emitting device package according to claim 16, wherein three or four light emitting devices are mounted on the mount.

18. The light emitting device package according to claim 17, wherein each of the light emitting devices emits red, green, or blue light.

* * * * *